United States Patent [19]

Sano et al.

[11] Patent Number: 4,470,786
[45] Date of Patent: Sep. 11, 1984

[54] MOLDING APPARATUS WITH RETRACTABLE PREFORM SUPPORT PINS

[75] Inventors: Takezo Sano, Shiga; Kenichi Tsuruyoshi, Kusatsu, both of Japan

[73] Assignee: Omron Tateisi Electronics Co., Japan

[21] Appl. No.: 392,475

[22] Filed: Jun. 28, 1982

[30] Foreign Application Priority Data

Jul. 28, 1981 [JP] Japan .............................. 56-118213
Jul. 28, 1981 [JP] Japan .............................. 56-118214

[51] Int. Cl.³ ........................... B29D 3/00; B29F 1/10
[52] U.S. Cl. .................................. 425/125; 264/40.1; 264/278; 264/272.14; 264/272.15; 425/110; 425/116; 425/123; 425/124; 425/149; 425/DIG. 5
[58] Field of Search .............. 264/278, 40.1, 40.5; 425/123, 125, 149, 110, 116, DIG. 5, 124

[56] References Cited

U.S. PATENT DOCUMENTS

| | | | |
|---|---|---|---|
| 3,238,287 | 3/1966 | Chapman | 264/276 |
| 3,330,004 | 7/1967 | Cloyd et al. | 72/386 |
| 3,363,040 | 1/1968 | Aoki | 264/278 |
| 3,670,071 | 6/1972 | Walchle et al. | 264/273 |
| 3,814,777 | 6/1974 | Schmidt | 264/40.1 |
| 4,000,877 | 1/1977 | Shead et al. | 425/125 |
| 4,052,241 | 10/1977 | Walter | 264/278 |
| 4,067,946 | 1/1978 | Rickert | 264/150 |
| 4,100,247 | 7/1978 | Shead et al. | 264/278 |
| 4,102,973 | 7/1978 | Hanning | 264/278 |
| 4,146,601 | 3/1979 | Bishop | 264/40.1 |
| 4,283,835 | 8/1981 | Obrochta et al. | 29/527.6 |
| 4,318,879 | 3/1982 | Gartner | 264/278 |

FOREIGN PATENT DOCUMENTS

| | | | |
|---|---|---|---|
| 4728692 | 7/1972 | Japan | 264/278 |
| 54-3158 | 1/1979 | Japan | 264/40.1 |
| 55-103938 | 8/1980 | Japan | 264/40.5 |
| 1353603 | 5/1974 | United Kingdom | 264/278 |
| 1430579 | 3/1976 | United Kingdom | 264/278 |

Primary Examiner—James B. Lowe
Attorney, Agent, or Firm—Cushman, Darby & Cushman

[57] ABSTRACT

A molding method and apparatus in which an insert part is supported in a mold cavity by a pin. The pin is withdrawn when the resin pressure in the mold exceeds a predetermined value.

1 Claim, 8 Drawing Figures

MOLDING APPARATUS WITH RETRACTABLE PREFORM SUPPORT PINS

BRIEF SUMMARY OF THE INVENTION

The present invention relates to a molding method of a molded product provided with insert parts and apparatus therefor.

As shown in FIG. 1 for the conventional method of forming a molded product provided with insert parts, it has been generally applied such means that an insert part 3 is previously charged in a molded cavity 2 formed in a metal mold 1. Further, this insert part 3 is pressed by a pin 4 inserted from the outside of the above described cavity 2, and then unhardened resin 5 is filled in said cavity 2 and hardened in that state. Finally, said pin 4 is extracted from the inside of the cavity 2.

However, in a molded product 6 obtained from the conventional molding method as described above, an evidence of said pins 4 is left as holes 7, as shown in FIG. 2, and holes 7 mar the external appearance of the product. Further, in case of using metal for the insert part 3, for instance, in case of using key switch electrical parts or the like, holes 7 cause failure in electrical insulation in addition to easy corrosion of the insert part 3. It is not possible to obtain a molded product without holes 7 from this molding method.

To eliminate the evidence of such pin holes 7 as in the above, no other way was known except that the pin 4 as described above is not used or the holes 7 are closed by after completion of molding work. However, the former method, in which floating, displacement, deformation and the like of the insert part are caused by molding pressure, charging shock, etc. of the resin at the time of molding to produce improper goods, can not be applied, while the latter method, in which afterprocesses are remarkably troublesome resulting in high cost, is impractical.

The present invention is presented to solve such technical problems as described above.

A main object of the present invention is to provide a molding method that the pin hole as described above is not left when a molded product with insert parts is formed.

An object of the present invention is to provide a molding method of good yield rate by preventing occurrence of improper goods arising from floating, displacement, deformation, etc. of the insert part.

Another object of the present invention is to provide an easy-to-manufacture molding without the necessity for performing a troublesome afterprocess.

Further object of the present invention to produce an excellent molded product at low cost that a pin hole is not left further corrosion or deteriorated insulation is not caused in the insert part.

Other and further objects of the present invention will become obvious upon an understanding of the illustrative embodiments about to be described or will be indicated in the appended claims, and various advantages not referred to herein will occur to one skilled in the art upon employment of the invention in practice.

DETAILED DESCRIPTION OF THE INVENTION

Figure 1:
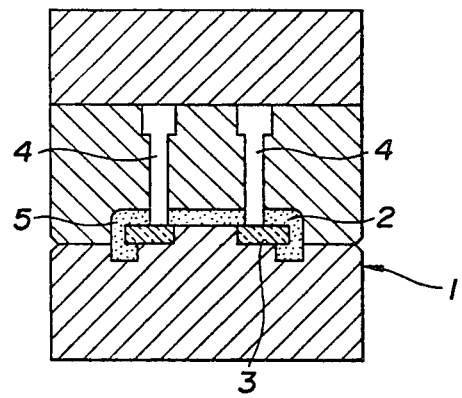
FIG. 1 is a cross section view showing the conventional molding method.
Figure 2:
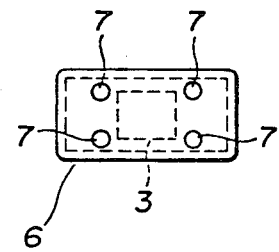
FIG. 2 is a plan view for a molded product obtained by the conventional method.
Figure 3A:
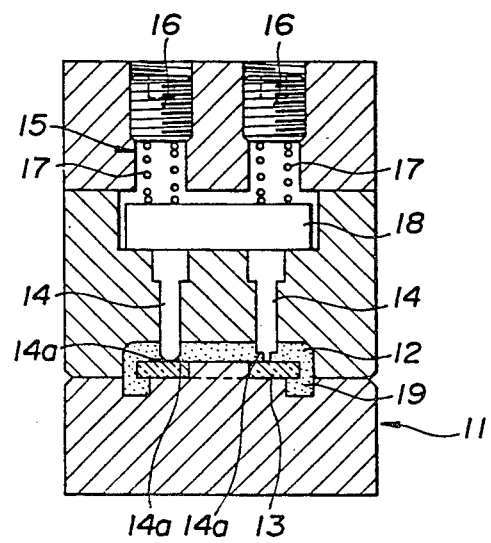
FIGS. 3 (A) and (B) are sectional views of a device utilizing a molding method relating to the present invention.
Figure 3B:
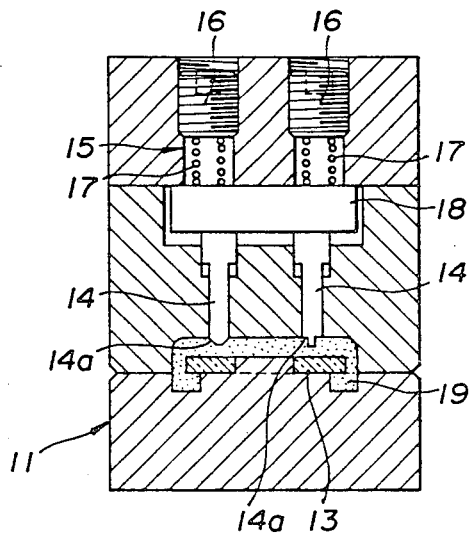

FIGS. 3 (A) and (B) show an embodiment of the device utilizing a molding method relating to the present invention.

Firstly, the molding device as shown in FIG. 3 (A) comprises pins 14, longitudinally and movably inserted into a metal mold 11 consisting of upper and lower molds from the outside of a mold cavity 12 to retain an insert part 13 previously inserted into said cavity 12, and a pressing means 15, normally urging this pin 14 in the direction of intrusion into said molded cavity 12. This pressing means 15 is constituted by coil springs 17 with their resilient force set by screws 16. Resilient force of the coil spring 17 is applied to the above described pins 14 through a backing plate 18. To an insertion end part of said pin 14 into said cavity 12, a pressure receiving side 14a is provided to receive charging pressure of unhardened resin 19, filled in said cavity 12 through a runner and gate, in the backward moving direction of said pin 14. This pressure receiving side 14a may be, as shown in the illustrated embodiment, formed to conical or stepped shape and the like in the point end of the pin 14. On the other hand, urging force of said normally pressing means 15 is preset to such a level that said pin 14 is moved backward by charging pressure of said resin immediately before completion of the charging of the unhardened resin 19 into said cavity 12.

Now explaining the molding method of the present invention, as shown in the FIG. 3 (A), the insert part 13 is previously inserted into the molded cavity 12. Further, this insert part 13 is press supported by the point end of the pin 14 urged by said coil spring 9, and then unhardened resin 19 is filled through the runner and gate. Then as shown in the FIG. 3 (B), in a state of charging the resin 19, that is, immediately before completion of its charging, said pin 14 is moved backward from said cavity 12 by charging pressure of said resin 19, and the resin 19 is further charged even after said pin 14 is moved backward.

Here the pin 14 can be moved backward from the molded cavity 12 immediately before completion of the charging of the resin 19 by the adequate setting of urging force of said normally pressing means 15 further by the provision of said pressure receiving side 14. In this way, there can be obtained a molded product without leaving a pin hole in place of the pin 14 for at least the insert part 13 visible. Here the matter worth paying attention is that floating, displacement, deformation, etc. of the insert part 13 are easy to occur not at the time at least immediately before completion of the resin charging but at the beginning of the charging of the resin 19. Accordingly, a pin hole is not left in the molded product and occurrence of improper goods due to the floating of insert parts 13 can be prevented to remarkably improve yield rate. In this way, corrosion in the insert part 13 can be eliminated, and a molded product of excellent quality especially without causing corrosion or deteriorated insulation and the like can be obtained in case of electrical products.

Figure 4:
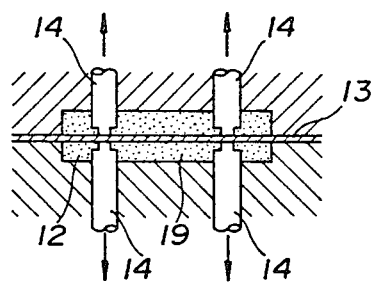
FIG. 4 is a sectional view of principal parts showing another embodiment of the present invention.

Now referring to another embodiment of the present invention in FIG. 4, the insert part 13 is floated in an intermediate part of the molded cavity 12 and supported by upper and lower pins 14, 14. The insert part 13, even if thin, is not deformed, and thus a molded product can be obtained in which the insert part 13 is correctly inserted to a specified position.

Figure 5A:
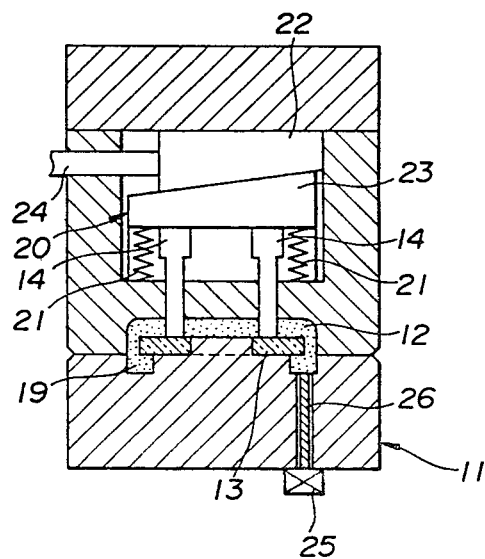
FIGS. 5 (A) and (B) are sectional views of a device showing another embodiment of the present invention.
Figure 5B:
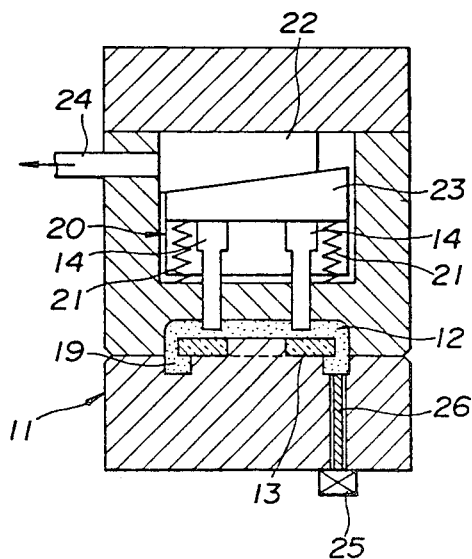

FIGS. 5 (A) and (B) are sectional views of a device showing still another embodiment of the present invention. The same portion as those in the before described embodiment is shown by the same and its description omitted.

As shown in FIG. 4, this device is provided with pins 14, longitudinally movably inserted into a metal mold 11 from the outside of a molded cavity 12 to retain an insert part 13 previously set in said cavity 12, and a pin driving mechanism 20, driving said pin 14 backward from the inside of the above described cavity 12. Further a timing detecting means, detecting the timing immediately before completion of the charging of the resin 19 into said cavity 12, is provided to operate the above described pin driving mechanism 20 on the basis of detection by said timing detecting means.

Here the above described pin driving mechanism 20 comprises coil springs 21, always urging said pins 14 to the direction for moving the pin backward from said cavity 12, slide core 22, shiftably driven in the direction at a right angle with said pin 14, and a backing plate 23, slidably contacted to said slide core 22 and moved to the longitudinal direction of said pin 14. The slide core 22 is connected to a driving source of oil hydraulic power or the like through a connecting rod 24. Further a sliding surface between the core 22 and the plate 23 is sloped to each other, and if the core 22 is driven rightward, the pin 14 is pressed downward as shown in the FIG. 5 (A) to press the insert part 13 set in the cavity 12. While if the core 22 is driven leftward, the pin 14 is backward moved upward, as shown in the FIG. 5 (B), by the resiliently restoring force of said spring 21 and detached from the insert part 13.

The above described timing detecting means, in the illustrated embodiment, is constituted by a pressure sensor 25 detecting pressure of the resin 19 filled in said cavity 12. The pressure sensor 25 receives charging pressure in the cavity 12 through an extension rod 26. When this pressure sensor 25 detects pressure immediately before completion of the charging of said resin 19, said pin driving mechanism 20 is operated on the basis of this detection to move said pin 14 backward immediately before completion of the charging of the unhardened resin 19 into the cavity 12. Detection pressure when operating the driving mechanism 20 shall be preset to a detection level.

Further the above described timing detecting means may be constituted by a timer with its illustration omitted. In this case, said timer is constituted in such a manner that nine hours are detected from the time of a charging operation start of the resin 19 into cavity 12, when said timer detects the lapse of preset time, said pin driving mechanism 20 is driven on the basis of this detection. Also in this way, said pin 14 can be moved backward immediately before completion of the charging of the resin 19 into the cavity 12.

Now using the molding device as described in the above, firstly as shown in the FIG. 5 (A), the insert part 13 is previously set in the molded cavity 12, said insert part 13 is press supported by the pin 14 inserted from the outside of said cavity 12, and then the unhardened resin 19 is filled into said cavity 12 through a runner and gate. Then as shown in FIG. 5 (B), immediately before completion of the charge of said resin 19, said pin 14 is moved backward and detached at least from said insert part 13, and in this way, the above described resin 19 is still charged even after the pin 14 is moved backward.

In this way, similar effect can be obtained to the before described embodiment.

Figure 6:
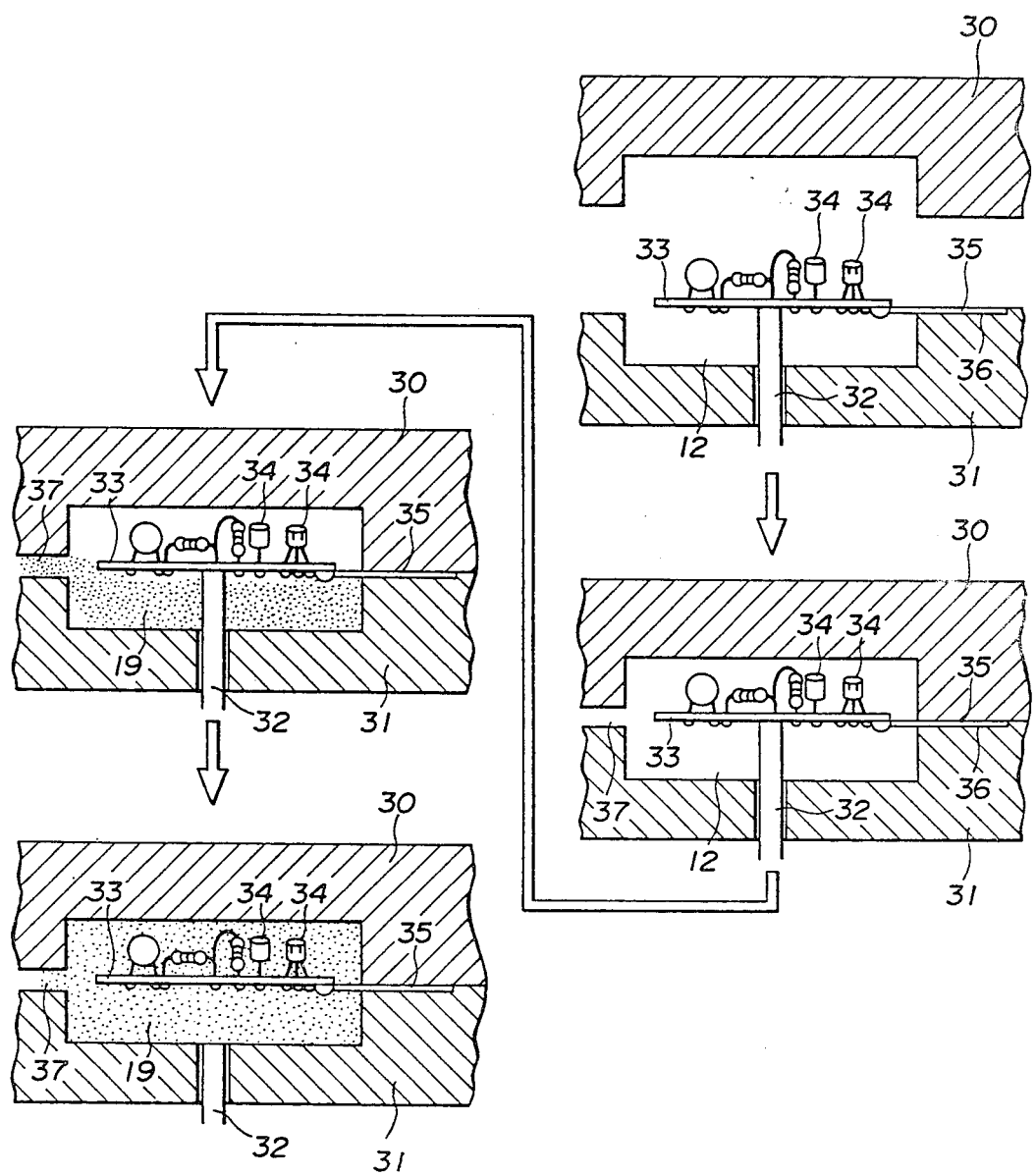
FIG. 6 is a process sectional view showing a further embodiment of the present invention.

FIG. 6 is a process explaining views showing still another embodiment of the present invention.

The numeral 30 shows an upper mold and 31 shows a lower mold, to this lower mold 31 an ejector pin 32, normally used for ejection of a molded product in the insert molding, is telescopically movably inserted into the cavity 12. The numeral 33 is a printed-circuit board mounted with various electronic parts 34, and the lower side of this printed-circuit board 33 is supported by said ejector pin 32 previously protruded into the cavity 12, and simultaneously a portion of input/output terminal 35 connected to this board 33 is stopped to a parting surface 36. In this way the printed-circuit board 33 is positioned into the cavity 12 and set.

In such means the printed-circuit board 33 is set to the inside of the cavity 12, and then the lower mold 31 is raised to tighten the mold, thereafter thermo-setting resin of epoxy resin or the like is filled in a pot, not shown in the drawing. Further, a plunger, not shown, is lowered to charge the resin 19 into the cavity 12 through a runner 37. Further the printed-circuit board 33 in the cavity 12, since its lower side is supported by the ejector pin 32 simultaneously its side is supported by the input/output terminal 35, is not rocked at all to hold a prescribed attitude when the resin 19 is charged.

If the resin 19 is charged in such a manner, said ejector pin 32 is lowered to the molding surface of the lower mold 31 immediately before completion of the charge of this resin 19, and then the printed-circuit board 33 in the cavity 12 is integrally resin molded. Then the lower mold 31 is lowered to open the mold, and said ejector pin 32 is protruded to eject and take out the molded product.

The present invention, as described above, is to integrally perform resin molding of a printed-circuit board formed by mounting the electronic part, that is, electronic circuitry device, and its use can be applied to the molding for a solid-stay relay, photoelectric switch or proximity switch and the like.

The same effect can be obtained as in the before described said embodiment by the molding method as described above.

When an electronic circuitry device formed by mounting electronic parts of this kind is integrally resin molded by transfer molding or the like, thermo-setting resin of epoxy resin is generally used. However, because the thermo-setting resin is hardened by chemical reaction, its forming takes time and is therefore not suitable for quantity production.

Therefore, the inventors of the present invention have applied polyphenilene sulfid belonging to thermoplastic resin instead of the above described resin. This resin is characterized by the molding capable at temperature of 280° C. under pressure of 50 kg/cm$^2$, manufactured and sold at present by Phillips Petroleum Co. in the United States with trade mark of "Ryton".

By application of this resin, forming time can be greatly decreased, and an electronic circuitry device of this kind can be produced at low cost.

As many apparently widely different embodiments of the present invention may be made without departing from the spirit and scope thereof, it is to be understood that the invention is not limited to the specific embodiments thereof except as defined in the appended claims.

What we claim is:

1. A molding apparatus comprising:
   a metal mold having upper and lower parts defining therebetween a mold cavity for receiving a resin;
   first and second pins extending into said cavity for supporting an insert part in said cavity;
   means urging said pin into said cavity including a backing plate mounted in a chamber adjacent said cavity and having a first surface engaging said pins and an opposed inclined surface;
   a pressure sensor for detecting the pressure in said cavity and having a portion in communication with said cavity;
   means engaging said pin for causing withdrawal of said pins when the detected pressure exceeds a predetermined value including at least one spring urging said backing plate in a direction to withdraw said pins from said cavity, a sliding plate having an inclined surface in contact with said inclined surface of said backing plate and means for moving said plate in a transverse direction to withdraw said pins from said cavity when said detected pressure exceeds said predetermined value.

* * * * *